(12) United States Patent
Zhao et al.

(10) Patent No.: US 12,270,830 B2
(45) Date of Patent: Apr. 8, 2025

(54) METHOD FOR ACHIEVING THE MEASURING SLIP OF MEMBRANE PROBES

(71) Applicant: MAXONE SEMICONDUCTOR CO., LTD., Jiangsu (CN)

(72) Inventors: Liangyu Zhao, Suzhou (CN); Haichao Yu, Suzhou (CN); Ailin Wang, Suzhou (CN)

(73) Assignee: MAXONE SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 17/726,765

(22) Filed: Apr. 22, 2022

(65) Prior Publication Data
US 2023/0168280 A1    Jun. 1, 2023

(30) Foreign Application Priority Data
Nov. 29, 2021   (CN) .......................... 202111435317.4

(51) Int. Cl.
*G01R 1/073* (2006.01)

(52) U.S. Cl.
CPC ....... *G01R 1/0735* (2013.01); *G01R 1/07342* (2013.01)

(58) Field of Classification Search
CPC ... G01R 1/0735; G01R 1/07342; H01L 22/34; H01L 22/20
See application file for complete search history.

(56) References Cited

U.S. PATENT DOCUMENTS

| 5,395,253 A | 3/1995 | Crumly |
| 5,825,192 A * | 10/1998 | Hagihara ........... G01R 31/2887 324/762.01 |
| 7,893,704 B2 | 2/2011 | Gleason et al. |

\* cited by examiner

*Primary Examiner* — David M Schindler
*Assistant Examiner* — Demetrius R Pretlow
(74) *Attorney, Agent, or Firm* — Oliff PLC

(57) ABSTRACT

The present invention relates to a method for realizing the measuring slip of membrane probe, wherein: an elastomer layer is placed between the rigid acting surface of the membrane probe head and the membrane on which the probe is arranged; on the axial plane of the probe, the elastomer layer takes any axial line passing through the probe as a boundary line, and there is a difference between the thickness of one side and thickness of the other side, so that the probe can deflect during the test, resulting in the measuring slip to penetrate or push away the surface oxide of the tested chip and achieve more stable contact.

4 Claims, 4 Drawing Sheets

METHOD FOR ACHIEVING THE MEASURING SLIP OF MEMBRANE PROBES

TECHNICAL FIELD

The invention belongs to the technical field of probe card and wafer test, in particular relates to a method for realizing the measuring slip of membrane probes, which is suitable for membrane probe head and membrane probe card.

BACKGROUND OF INVENTION

In recent years, with the development and popularization of 5G technology and consumer electronics technology, semiconductor devices continue to develop towards miniaturization, integration and densification of pad pitch, and the working frequency continues to be improved, and the wafer level test for high frequency has gradually become an important part of RF chips production. Compared with other types of probe cards, the membrane probe card realizes small-scale probe structure processing and high-precision signal line structure parameter control, reduces the generation of parasitic capacitance and inductance, greatly shortens the signal path and improves the impedance matching degree, so it is widely used in wafer level test and analysis for high frequency.

During wafer test, it is necessary to provide appropriate measuring slippage and controllable contact force.

Measuring slip refers to the slight horizontal movement of the probe when the probe starts to contact with the tested pad and starts the vertical lifting movement. It is extremely necessary to push away the oxide on the surface of the tested pad or bump to obtain stable electrical contact: if the slip is too small, the vertical contact force required for the probe to obtain stable contact may be too large, causing damage to the Pad; if the slip is too big, the probe may contact the outer passivation layer of Pad, causing damage to the tested object.

The controllable contact force plays a positive role in ensuring that the chip pad is not damaged. At present, the commonly used pad and bump materials include aluminum, gold, copper or solder: aluminum surface is prone to oxidize in the air, and the force of 3-5 gf is generally required in the test to penetrate or push away the surface oxide and achieve stable contact; the contact force required for gold material is very small due to its softness, generally between 0.1-1 gf; and the bigger force is required for copper material to achieve good contact, about 5-6 gf. With the miniaturization and integration of semiconductor technology, the thinner dielectric layer between the metal layer of the welding pad and the low-k layer also has improved the control requirements for the contact force of the probe.

The U.S. Pat. No. 5,395,253 proposes: The initial membrane is in the tensile state, and when the probe comes into contact with the tested Pad and starts the vertical lifting movement, the membrane gradually comes to the relaxed state, and the probe will make a slight horizontal movement toward the central area of the membrane, resulting in the measuring slip. A significant disadvantage of this method is that the measuring slippage of the probe is related to the position of the probe relative to the center of the membrane, and it is not even.

In the prior art, the most representative structure is shown in U.S. Pat. No. 7,893,704, and it proposes a new type of membrane probe structure, which designs the probe as a cantilever-like structure, and realizes the measuring slip by using the rotation of the cantilever-like probe structure around the end of the cantilever in the test. However, in this way, the stress is concentrated and the membrane is easily damaged as the probe has to rotate around the end of the cantilever repeatedly.

It's obvious that there is an urgent need in the art for a method to achieve the measuring slip of membrane probe, which can achieve appropriate measuring slip and provide controllable contact force, particularly, can reduce the stress of the membrane probe and prolong the service life of the membrane probe.

DISCLOSURE OF THE INVENTION

The invention aims to provide a method for measuring slip of membrane probe, which can achieve appropriate measuring slip of probe and provide controllable contact force during the test, particularly, can reduce the stress of the membrane probe during the use and prolong its service life.

In order to achieve the above-mentioned purpose, the technical solution adopted in the present invention is: a method for realizing the measuring slip of membrane probe, wherein an elastomer layer is placed between the rigid acting surface of the membrane probe head and the membrane on which the probe is arranged; on the axial plane of the probe, the elastomer layer takes any axial line passing through the probe as a boundary line, and there is a difference between the thickness of one side and thickness of the other side, so that the probe can deflect during the test, resulting in measuring slip.

In above described technical solution, a groove is arranged on the rigid acting surface, the groove wall is aligned with the boundary line, and the elastomer layer is used to cover the whole rigid acting surface and fill the groove, with the elastomer layer taking any axial line passing through the probe as the boundary line, there is a difference between the thickness of one side and thickness of the other side.

In above described technical solution, the rigid acting surface is designed as an bevel inclined on the axial plane of the probe, and one side surface of the elastomer layer is fitted with the bevel.

In above described technical solution, the rigid acting surface is provided with one or more curved surfaces concave in the axial plane of the probe, and one side surface of the elastomer layer is fitted with the curved surface.

In above described technical solution, the elastomer layer is on the axial plane of the probe and the thickness of the elastomer layer on the axial plane of the probe closer to the center of the rigid acting surface is greater than that on the outside.

In above described technical solution, the boundary line coincides with the axial line of the probe.

The membrane probe card commonly used in the prior art includes PCB board, connector and membrane probe head, and the membrane probe head includes a support providing a rigid acting surface, a membrane covered on the rigid acting surface of the support, a probe and interconnected wire arranged on the membrane, and the membrane is directly covered on the rigid acting surface.

And the present invention makes a breakthrough in arranging an elastomer layer between the rigid acting surface and the membrane where the probe is arranged, and the elastomer layer is on the axial plane of the probe and takes any axial line passing through the probe as the boundary line, and there is a difference between the thickness of its one side and thickness of the other side, so that the probe can deflect appropriately during the contact process, resulting in the measuring slip to penetrate or push away the surface oxide of the tested chip and achieve more stable contact.

The value of the difference in "a difference between the thickness of one side and thickness of the other side of the elastomer layer taking any axial line passing through the probe as the boundary line" needs to be adjusted according to the elastic coefficient of the elastomer. In general, the vertical movement of the probe card is between 60-100 um, and the horizontal slippage is only about 3-8 um during the test. Based on the probe length of 50 um, the deflection angle of the probe needs to be about 3-10° to produce a horizontal slippage of 3-8 um, that is, the horizontal angle of the elastomer surfaces on two sides of the probe is required to be only 3-10°. Assuming that the horizontal length of the probe base is 300 um, the height difference between the two ends of the probe is 18-48 um. If the limit compression of the elastomer of unit thickness within the elastic range is a, the thickness difference of the elastomer at the two ends is required to be at least 18/a. Assuming that the elastic coefficient of the elastomer is b, that is, the force required to compress the unit displacement is b, and the contact force required during the probe test is c, the total thickness of the elastomer shall not be less than c/b.

During the test: In the initial state, the probe doesn't contact the tested chip Pad, the elastic component covered above the rigid support is in the initial compression state, and the elastomer layer is also in the uncompressed state; with the application of test OD, the probe contacts the tested chip Pad and displaces in the vertical direction, and most of the displacement is absorbed by the elastic component, and the rest is absorbed by the probe and the elastomer layer together; at this time, due to the different thickness of the elastomer covered on two sides of the probe, the probe deflects slightly while moving vertically, and the probe slips in the horizontal direction, which can push away the dirt and oxide on the surface of the tested chip and achieve a more stable electrical connection.

The beneficial effects of the invention are:
1. The elastomer layer lined on two sides of each probe has a thickness difference, so that it achieves the vertical movement of the probe and the side-slip in the horizontal direction to realize the stable and reliable electrical contact.
2. The invention can finally control the thickness difference of the elastomer layer on two sides of the probe by controlling the eccentricity between the boundary line and the axial line of the probe, as well as the thickness difference of the two sides of the elastomer, so as to achieve the control of measuring slippage, and then achieve the control of the contact force by controlling the thickness of the plane part of the elastomer layer.
3. The invention achieves the absorption and compatibility of solving the planarity problems such as local height difference and overall inclination of the probe by adding an elastomer layer and prevents the problems of damage of tested Pad or loose connection and open circuit of the probe caused by the excessive contact force due to too long or too short of the local probe.

Figure 1:
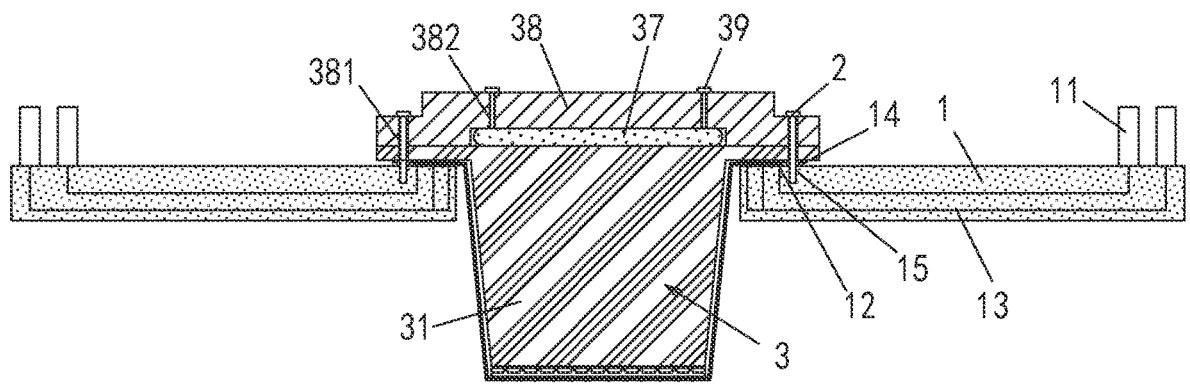
FIG. 1 is a schematic view of a membrane probe card according to embodiment 1 and embodiment 2 of the present invention.
Figure 2:
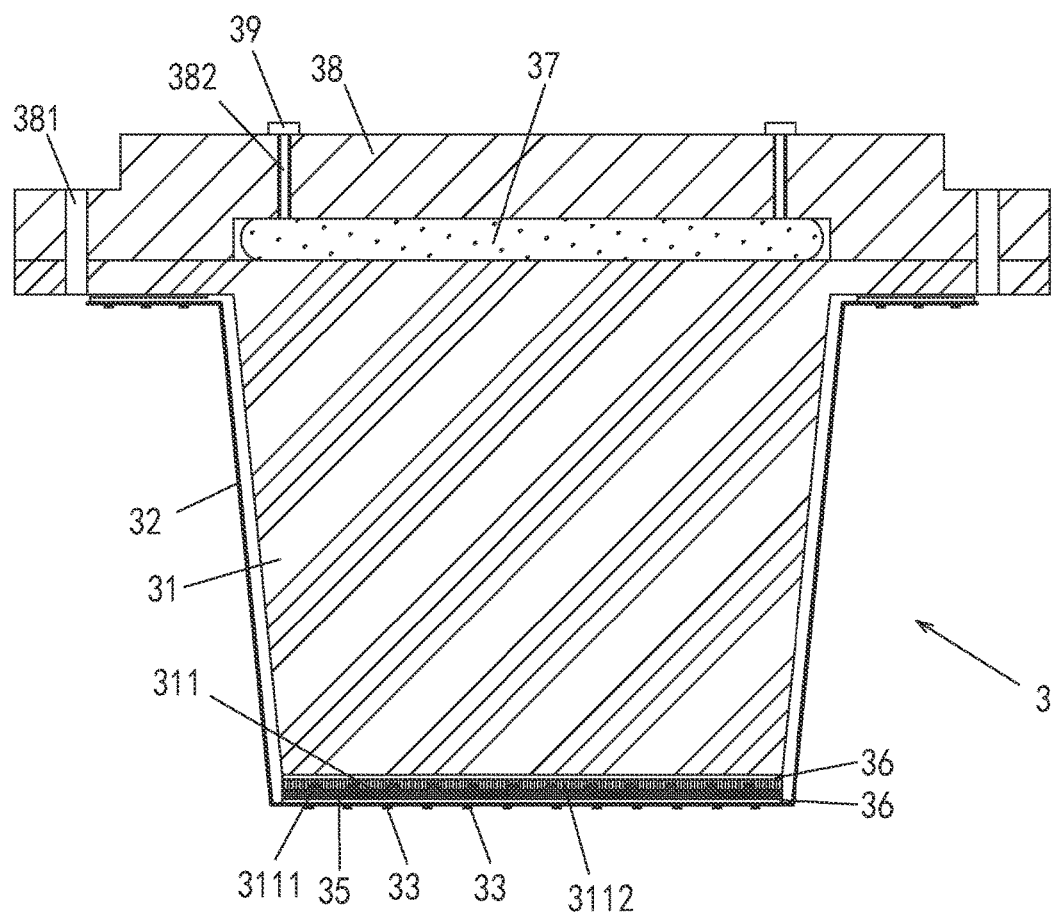
FIG. 2 is a schematic view of a membrane probe head according to embodiment 1 and embodiment 2 of the present invention.
Figure 3:
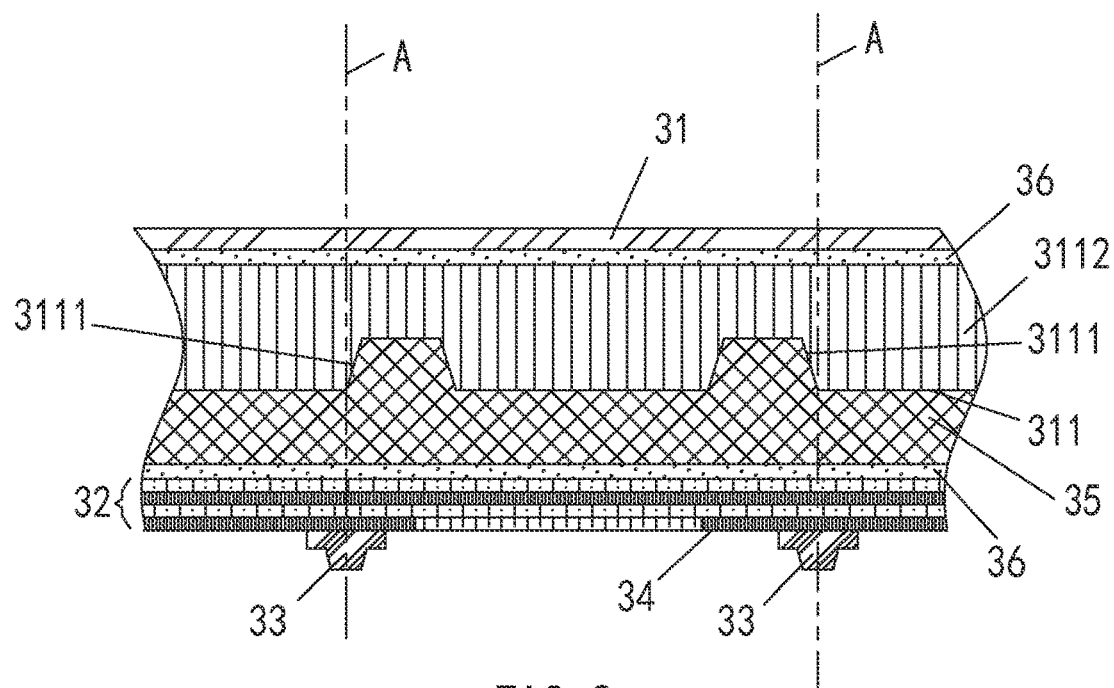
FIG. 3 is a partial enlarged view of a membrane probe head according to embodiment 1 and embodiment 2 of the present invention.
Figure 4:
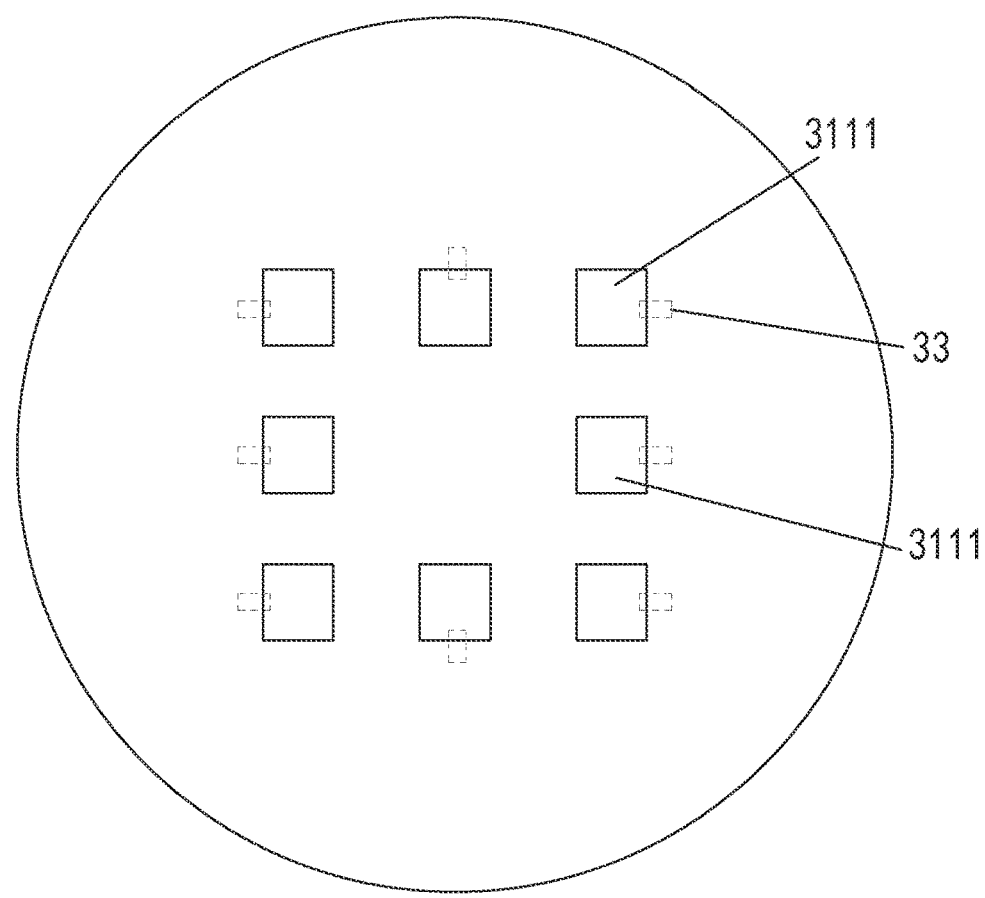
FIG. 4 is a view of the corresponding positions of the grooves of the membrane probe head and the probe according to embodiment 1 of the present invention.

In the above figures: 1. PCB board; 11. Coaxial connector; 12. Signal connection point; 13. PCB wire; 14. Spring structure; 15. PCB-end threaded hole; 2. Connector; 3. Membrane probe head; 31. Support; 311. Rigid acting surface; 3111. Groove; 3112. Supporting rigid body; 3113. Bevel.
32. Membrane;
33. Probe; 331. Probe base structure; 332. Probe tip structure;
34. Interconnecting wire;
35. Elastomer layer;
36. Adhesive layer;
37. Elastic component;
38. Stiffener; 381. Assembly screw holes; 382. Leveling screw holes;
39. Leveling screw.

SPECIFIC EMBODIMENT

With reference to the accompanying drawings and embodiment, the present invention will be described in detail.

Embodiment 1: A method for achieving measuring slip of a membrane probe, as shown in FIG. 1-6:

A membrane probe card usually consists of a PCB board 1, a connector 2 and a membrane probe head 3; The membrane probe head 3 consists of a support 31 providing a rigid acting surface 311, a membrane 32 covering the rigid acting surface 311 of the support 31, a probe 33 and an interconnecting wire 34 arranged on the membrane 32.

The method of the embodiment is to arrange an elastomer layer 35 between the rigid acting surface 311 of the membrane probe head and the membrane 32 on which the probe 33 is arranged, and the elastomer layer 35 is on the axial plane of the probe 33 and takes any axial line passing through the probe as the boundary line A, and there is a difference between the thickness of its one side and thickness of the other side, so that the probe 33 can deflect during the test, resulting in the measuring slip L.

Specifically, a groove 3111 is arranged on the rigid acting surface 311. As shown in the figure, the support 31 includes a supporting rigid body 3112 fixed on it, using the surface of the supporting rigid body 3112 as the rigid acting surface 311, and a groove 3111 is arranged on it. And the groove wall of the groove 3111 is aligned with the boundary line A, and the elastomer layer 35 is used to cover the whole rigid acting surface and fill the groove 3111, so that the elastomer layer 35 takes any axial line passing through the probe 33 as the boundary line A, so that there is a difference between the thickness of one side and thickness of the other side.

The value of the difference needs to be adjusted according to the elastic coefficient of the elastomer. In general, the vertical movement of the probe card is between 60-100 um, and the horizontal slippage is only about 3-8 um during the test. Based on the probe length of 50 um, the deflection angle of the probe needs to be about 3-10° to produce a horizontal slippage of 3-8 um, that is, the horizontal angle of the elastomer surfaces on two sides of the probe is required to be only 3-10°. Assuming that the horizontal length of the probe base is 300 um, the height difference between the two ends of the probe is 18-48 um. If the limit compression of the elastomer of unit thickness within the elastic range is a, the thickness difference of the elastomer at the two ends is required to be at least 18/a. Assuming that the elastic coefficient of the elastomer is b, that is, the force required to compress the unit displacement is b, and the contact force required during the probe test is c, the total thickness of the elastomer shall not be less than c/b.

Further, it is preferable that the elastomer layer 35 is on the axial plane of the probe 35 and the thickness of the elastomer layer on the axial plane of the probe closer to the center of the rigid acting surface is greater than that on the outside, so as to avoid excessive force in the middle of the membrane after the deflection of the probe during the test.

Figure 5:
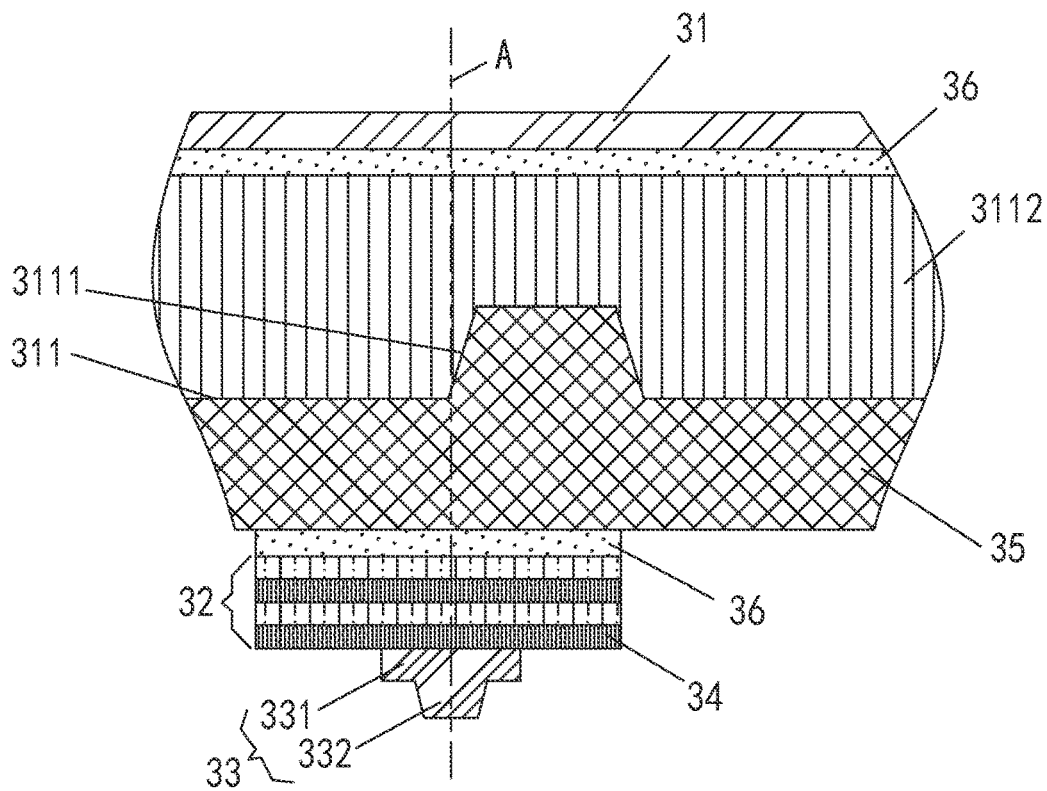
FIG. 5 is a view of the probe position before the test of the membrane probe head according to embodiment 1 of the present invention.

As shown in FIG. 5, it is preferable that the boundary line A coincides with the axis line of the probe.

Specifically, the structure of the membrane probe card according to the embodiment 1 is as follows:

PCB board 1 is a multi-layer epoxy resin circuit board, on which coaxial connector 11 and signal connection point 12 are distributed, and PCB wire 13 is distributed inside, which respectively connects coaxial connectors 11 to corresponding signal connection points 12 to realize electrical signal transduction and transmission; the PCB board 1 is also distributed with spring structure 14 and PCB-end threaded hole 15 on its surface; the center of PCB board 1 is hollowed out to accommodate the membrane probe head 3; the spring structure 14 is located at the outer circumference of the central hollow part of the PCB board 1 and is used to realize the close connection with the membrane probe head 3.

The support 31 is a rigid body, wherein it has a convex protruding downward in the middle and the lower surface of the convex is used as the rigid acting surface 311. A connecting surface is arranged on the periphery of the convex of the support 31 to contact against the PCB board 1, and the connecting surface is also covered by the membrane 32, and a probe 33 is also arranged at the membrane 32 corresponding to the connecting surface, and the probe 33 is used for docking with the PCT board 1.

The support 31 is first fixed with a supporting rigid body 3112 through an adhesive layer 36, and the surface of the supporting rigid body 3112 is used as the rigid acting surface 311, and grooves 3111 are arranged on it and the grooves 3111 are arranged towards the probe 33 and correspond to the probes 33 respectively, and the grooves 3111 and the projections of corresponding probes 33 on the acting surface 311 are eccentric to each other; the elastomer layer 35 is embedded between the acting surface 311 and the membrane 32 and the elastomer layer 35 is provided with convex inserts corresponding to each groove 3111, and the convex inserts of the elastomer layer 35 fill the corresponding groove 3111, so in this way, there is a thickness difference between the two sides of each probe 33 on the elastomer layer 35.

Specifically, the upper surface of the elastomer layer 35 is conformal to the surface of supporting the rigid body 3112 and completely fills in the groove 3111, while the lower surface of the elastomer layer 35 is parallel to the acting surface 311. The elastomer layer 35 has a certain thickness relative to the surface of the supporting rigid body 3112, and the thickness of the elastomer layer 35 on two sides of the wall edge of the groove 3111 is different. The elastomer layer 35 is made from flexible materials such as PDMS and silica gel, etc., and the elasticity can be adjusted by adjusting the material ratio and curing temperature, so as to realize the absorption and compatibility of slightly height difference between the tested chip Pad or probe structure.

Specifically, the vertical section of the groove 3111 is column-shaped or truncated-shaped, and the figure shows the truncated-shaped. And the projection of the probe 33 in the up-down direction is across the outer contour line of the corresponding groove 3111.

The probe 33 specifically consists of a probe base structure 331 and a probe tip structure 332. The probe tip structure 332 is located on the probe base structure 331. The probe base structure 331 can be rectangular, cylindrical, prismatic, etc., and can be made from rhodium, Ni or PD-Ni, Ni—B alloy and other high-hardened materials. The probe tip structure can be the shape of truncated pyramid or trustum, cone, etc., and can be made from wear-resistant materials such as rhodium, Ni or PD-Ni, Ni—B alloy.

A stiffener 38 is also arranged above the support 31, and the stiffener 38 is a metal plate with a concave area in the center, and it's equipped with assembly screw holes 381 and leveling screw holes 382. Its edge is connected with the support 31 and the central concave area is used to accommodate elastic component 37 and the elastic component 37 can be an elastomer structure such as an air bag and a multi-pawl spring. As shown in the figure, the elastic component 37 is an air bag. The leveling screw 39 is located in the leveling screw hole 382, and the bottom is in contact with the upper surface of the elastic component 37. Adjusting the relative position of several leveling screws 39 can realize the correction of the inclination between the stiffener 38 and the support 31.

The elastic component 37 is located between the stiffener 38 and the support 31. During the test, the elastic component 37 is in a compressed state. When OD is applied, the elastic component 37 can undergo elastic deformation and absorb the displacement in the vertical direction.

Figure 6:
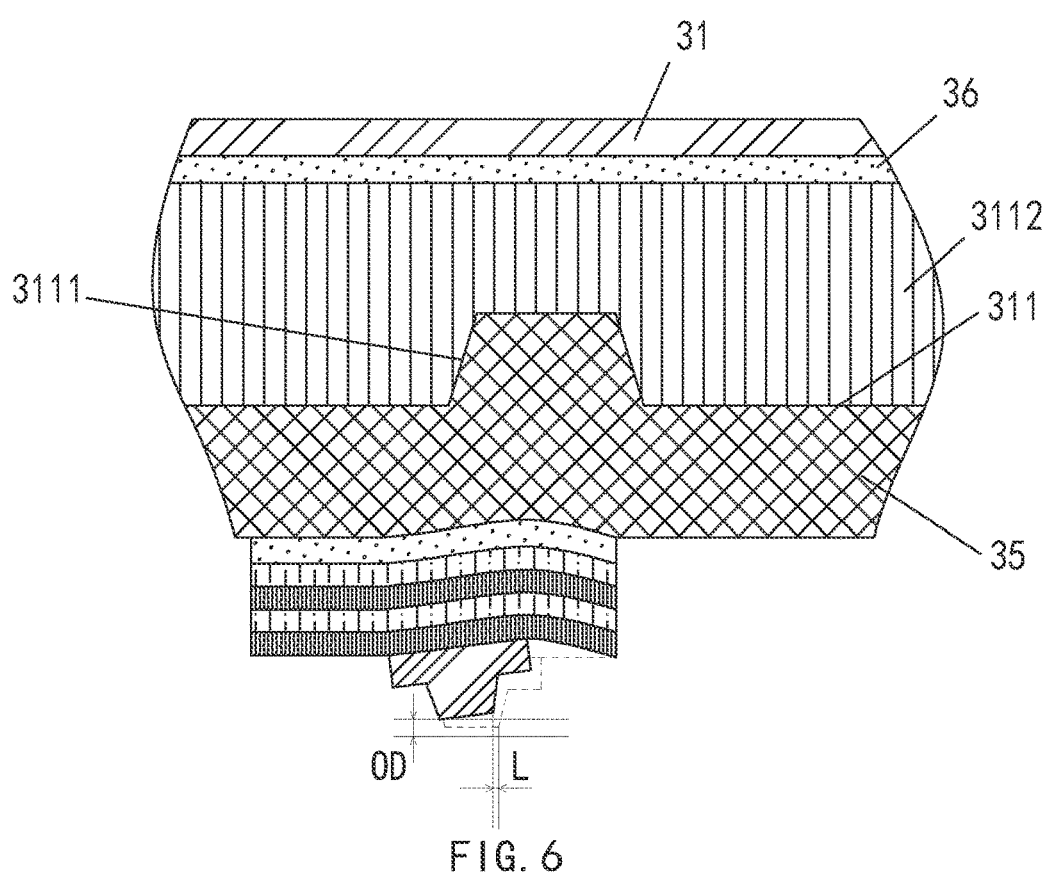
FIG. 6 is a view of comparison of probe position during the test of the membrane probe head according to embodiment 1 of the present invention.

During the test: In the initial state as shown in FIG. 5, the probe 33 doesn't contact the tested chip Pad, the elastic component 37 is in the initial compression state, and the elastomer layer 35 is also in the uncompressed state; with the application of test OD as shown in FIG. 6, the probe contacts the tested chip Pad and displaces in the vertical direction, and most of the displacement is absorbed by the elastic component 37, and the rest is absorbed by the probe 33 and the elastomer layer 35 together; due to the different thickness of the elastomer layer 35 on two sides of the probe 33, the probe 33 deflects slightly while moving vertically, resulting in the slippage with the distance of L, which can push away the dirt and oxide on the surface of the tested chip and achieve a more stable electrical connection.

Figure 7:
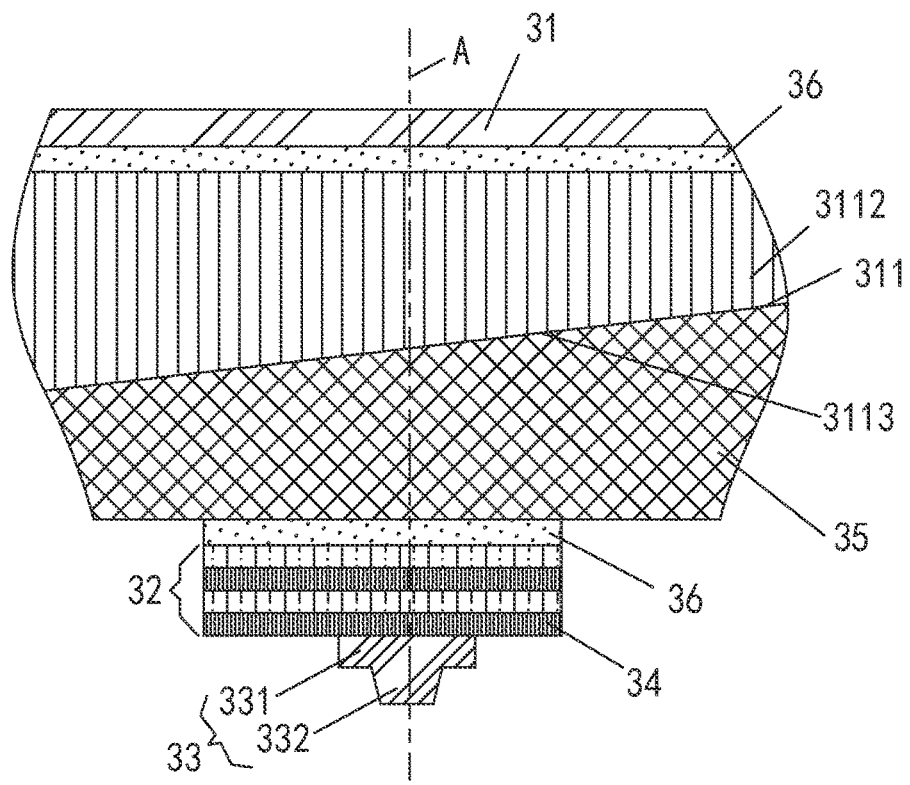
FIG. 7 is a view of the probe position before the test of the membrane probe head according to embodiment 2 of the present invention.
Figure 8:
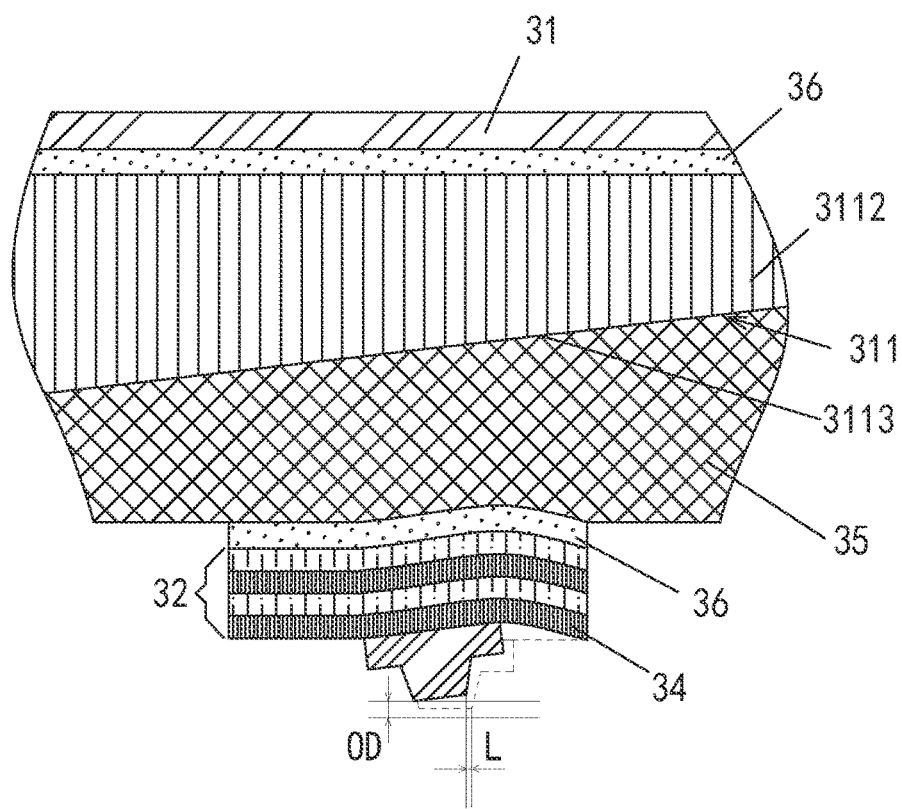
FIG. 8 is a view of the probe position during the test of the membrane probe head according to embodiment 2 of the present invention.

Embodiment 2: A method for achieving measuring slip of a membrane probe, as shown in FIG. 7-8:

The method of the embodiment is to arrange an elastomer layer 35 between the rigid acting surface 311 of the membrane probe and the membrane 32 on which the probe 33 is arranged, and its difference from embodiment 1 is that the rigid acting surface 311 is designed as one or several bevels 3113 inclined on the axial plane of the probe 33, and the slope of the bevel 3113 at the boundary line A is chosen according to the required deflection angle. The specific test status is shown in FIG. 7 and FIG. 8.

The specific structure is the same as that of the membrane probe head in embodiment 1, so it will not be repeated here.

The above embodiments are used as examples, and the following practical changes can be made in practice:
1. The rigid acting surface can also be equipped with one or several curved surfaces concave in the axial plane of the probe 33 to achieve a difference between the thickness of one side of the elastic layer 35 and thickness of the other side, so that the probe can deflect during the test, resulting in measuring slip.
2. The boundary line A can be adjusted according to the deflection of the probe 33. As long as the boundary line A passes through the probe 33, it does not need to coincide with the axial line of the probe 33. It's preferable that the boundary line A coincides with the axial line of the probe 33.
3. The supporting rigid body 3112 can be removed and not used; the adhesive layer 36 between the membrane 32 and the elastomer layer 35 can also be removed. The membrane 32 can be fixed relative to the lower surface of the supporting elastic layer 352 in other ways, or not fixed but only tightened against the lower surface of the supporting elastic layer 352.

It should be noted that the above described embodiments are only for illustration of technical concept and characteristics of present invention with purpose of making those skilled in the art understand the present invention, and thus these embodiments shall not limit the protection range of present invention. The equivalent changes or modifications according to spiritual essence of present invention shall fall in the protection scope of present invention.

The invention claimed is:

1. A method for realizing a measuring slip of a membrane probe, comprising:
   deflecting the membrane probe during a test, wherein:
      an elastomer layer is placed between a rigid acting surface of a membrane probe head and a membrane on which the membrane probe is arranged;
      a boundary line extends along any axial line that both: (1) passes through both the elastomer layer and the membrane probe and (2) is perpendicular to the rigid acting surface; and
      a first thickness of the elastomer layer on a first side of the boundary line is different from a second thickness of the elastomer layer on a second side of the boundary line opposite to the first side so that the membrane probe can deflect during the test, resulting in the measuring slip, wherein:
         a groove is arranged on the rigid acting surface,
         a groove wall is aligned with the boundary line, and
         the elastomer layer is used to cover the whole rigid acting surface and fill the groove.

2. The method for realizing the measuring slip of the membrane probe according to claim 1, wherein the rigid acting surface is designed as a bevel inclined relative to the boundary line with a side surface of the elastomer layer fitted with the bevel.

3. The method for realizing the measuring slip of the membrane probe according to claim 1, wherein a thickness of the elastomer layer closer to a center of the rigid acting surface is greater than that on an outside of the rigid acting surface.

4. The method for realizing the measuring slip of the membrane probe according to claim 1, wherein the boundary line coincides with an axial centerline passing through a center of the probe.

* * * * *